US012763677B2

(12) United States Patent
Mazza et al.

(10) Patent No.: US 12,763,677 B2
(45) Date of Patent: Oct. 13, 2026

(54) SYSTEMS AND METHODS FOR VOLTAGE CONVERSION

(71) Applicant: GM GLOBAL TECHNOLOGY OPERATIONS LLC, Detroit, MI (US)

(72) Inventors: Jason Mazza, Bayonne, MI (US); Anthony J. Corsetti, Rochester Hills, MI (US); Robert J. Heydel, Jr., Clawson, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 356 days.

(21) Appl. No.: 18/661,340

(22) Filed: May 10, 2024

(65) Prior Publication Data

US 2025/0350197 A1 Nov. 13, 2025

(51) Int. Cl.

| | |
|---|---|
| ***H02M 3/00*** | (2006.01) |
| ***B60L 15/00*** | (2006.01) |
| ***H02M 1/00*** | (2007.01) |
| ***H05K 7/14*** | (2006.01) |

(52) U.S. Cl.
CPC ........... *H02M 3/003* (2021.05); *B60L 15/007* (2013.01); *H02M 1/007* (2021.05); *H05K 7/14329* (2022.08); *B60L 2210/10* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,465,177 B2 * | 12/2008 | Wood | H01R 13/005 | 439/247 |
| 8,508,069 B2 * | 8/2013 | Schaffnit | B60L 50/51 | 307/10.1 |
| 8,760,855 B2 * | 6/2014 | Howes | H05K 7/20936 | 361/677 |
| 10,003,112 B1 * | 6/2018 | Boor | B60L 58/26 | |
| 11,557,962 B2 * | 1/2023 | Parto | G05F 1/46 | |
| 11,696,417 B2 * | 7/2023 | Feurtado | H02M 1/088 | 361/679.01 |
| 11,996,770 B2 * | 5/2024 | Parto | G05F 1/46 | |

(Continued)

FOREIGN PATENT DOCUMENTS

| | | |
|---|---|---|
| DE | 102020124157 A1 | 3/2021 |
| DE | 102022118090 A1 | 2/2023 |

*Primary Examiner* — Lisa Lea-Edmonds
(74) *Attorney, Agent, or Firm* — Ingrassia Fisher & Lorenz, LLP | IFL

(57) ABSTRACT

Systems and methods are provided for voltage conversion. The systems include power converters configured to convert an electrical current from a primary voltage to a secondary voltage, a casing, wherein the power converters are secured to exterior surfaces of the casing, a stack that includes busbars enclosed within the casing that are each configured to conduct the electrical current at the secondary voltage from the power converters, wherein each of the busbars are electrically isolated from each other and from the casing, wherein a first power converter is electrically coupled to a first busbar and not to a second busbar, and a second power converter is electrically coupled to the second busbar and not to the first busbar, and terminals secured to the casing and configured to conduct the electrical current at the secondary voltage from the busbars to an electrical system.

20 Claims, 6 Drawing Sheets

(56) References Cited

U.S. PATENT DOCUMENTS

| | | | | |
|---|---|---|---|---|
| 12,325,327 | B2 * | 6/2025 | Ahmed | B60L 58/22 |
| 12,604,442 | B2 * | 4/2026 | Frank | H05K 7/14329 |
| 2005/0088835 | A9 * | 4/2005 | Beihoff | H05K 7/20927<br>361/818 |
| 2010/0044766 | A1 * | 2/2010 | Tsuchiaki | H10D 64/0112<br>257/E27.084 |
| 2021/0057708 | A1 * | 2/2021 | Castillo | B60L 50/66 |
| 2021/0313881 | A1 * | 10/2021 | Parto | G05F 1/46 |
| 2023/0268827 | A1 * | 8/2023 | Parto | G05F 1/46<br>323/271 |
| 2024/0399904 | A1 * | 12/2024 | Archambo | B60L 1/12 |
| 2025/0062683 | A1 * | 2/2025 | Parto | G05F 1/46 |
| 2025/0132694 | A1 * | 4/2025 | Contreras | H02M 7/797 |
| 2025/0350197 | A1 * | 11/2025 | Mazza | B60L 15/007 |

* cited by examiner

SYSTEMS AND METHODS FOR VOLTAGE CONVERSION

INTRODUCTION

The technical field generally relates to voltage conversion systems, and more particularly relates to systems and methods that include a redundant power converter and busbar system that has a stacked configuration.

Electric and hybrid vehicles include a rechargeable energy storage system (RESS) that includes a battery or set of batteries used to store and supply electrical energy to power the vehicles' electric motors and other electrical systems. RESSs typically include high-capacity lithium-ion batteries, but can also encompass other types of rechargeable batteries such as nickel-metal hydride (NiMH) or solid-state batteries.

The voltage output of a RESS can vary depending on several factors, including the design of the battery pack and the specific requirements of the vehicle it powers. For example, the voltage output of the RESS may be in the range of several hundred volts to over 800 volts. This higher voltage may be necessary to efficiently power the electric motors and other electrical systems in the vehicle.

In some situations, it may be desirable to provide integration between the RESS and the vehicle's conventional 12-volt electrical system. Therefore, the vehicles may include an accessory power module (APM) configured to manage and distribute power to various accessory devices and systems in the vehicle. The APM may function as a central hub for controlling power flow to components such as interior lighting, audio systems, infotainment displays, climate control systems, and other electrical systems (collectively referred to herein as accessories of the vehicle). The APM may receive power from the RESS and regulate and distribute this power to different accessory circuits based on the vehicle's needs and user inputs. Due to the high voltage output of the RESS, the APM may provide DC-to-DC voltage conversion to reduce the RESS voltage output to the 12-volt level.

Due to an ongoing demand to promote energy efficiency and reliability in electric and hybrid vehicles, it is desirable to provide systems and methods that improve the efficiency and operation of the APM, for example, the DC-to-DC voltage conversion function. Furthermore, other desirable features and characteristics of the present disclosure will become apparent from the subsequent detailed description and the appended claims, taken in conjunction with the accompanying drawings and the foregoing introduction.

SUMMARY

A system is provided for voltage conversion and current distribution. In one example, the system includes at least two power converters configured to convert an electrical current from a primary voltage to a secondary voltage, a casing having walls and a cavity defined therebetween, wherein the at least two power converters are secured to exterior surfaces of the casing, a stack that includes at least two busbars enclosed within the casing that are each configured to conduct the electrical current at the secondary voltage from the at least two power converters, wherein each of the at least two busbars within the stack are electrically isolated from each other and from the casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar, and terminals secured to the casing and configured to conduct the electrical current at the secondary voltage from the at least two busbars to an electrical system coupled to the terminals.

In various examples, the system may include isolation layers enclosed within the casing and disposed between each of the at least two busbars and between the at least two busbars and the casing.

In various examples, the isolation layers of the system may include low electrical conductivity polymer materials.

In various examples, the casing of the system may be elongated and the at least two power converters may be aligned along the casing.

In various examples, the power converters of the system may be printed circuit boards directly secured to the exterior surfaces of the casing, wherein the casing may be configured to conduct heat from the power converters.

In various examples, the system may include conductive members extending from the power converters and into the casing, wherein a first conductive member of the conductive members electrically couples the first power converter to the first busbar and a second conductive member of the conductive members electrically couples the second power converter to the second busbar. in various examples, the power converters of the system may be secured to a first side of the casing, wherein each of the conductive members extend through holes in each of the at least two busbars and out of a second side of the casing opposite the first side, wherein the conductive members are coupled to the terminals at the second side of the casing.

In various examples, the casing of the system may be configured to provide electrical grounding and electromagnetic shielding. In various examples, the casing of the system may include at least two pieces that may be electrically isolated from each other, and the at least two pieces may be configured to independently provide electrical grounding.

A method is provided for voltage conversion and current distribution. In one example, the method includes converting an electrical current from a primary voltage to a secondary voltage with at least two power converters that are secured to exterior surfaces of a casing, conducting the electrical current at the secondary voltage from the power converters with a stack that includes at least two busbars enclosed within a cavity of the casing, wherein each of the at least two busbars within the stack are electrically isolated from each other and from the casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar, and supplying the electrical current at the secondary voltage to an electrical system.

In various examples, the method may include electrically isolating the at least two busbars from each other and from the casing with isolation layers enclosed within the casing.

In various examples, the method may include securing the power converters to the casing, wherein the casing is elongated and the at least two power converters are aligned along the casing.

In various examples, the power converters may be printed circuit boards, and securing the power converters to the casing may include directly securing the power converters to the exterior surfaces of the casing such that the casing conducts heat from the POWER converters during operation thereof.

In various examples, the method may include electrically coupling the first power converter to the first busbar with a first conductive member extending from the first power converter and into the casing, and electrically coupling the second power converter to the second busbar with a second conductive member extending from the second power converter and into the casing. in various examples, the power converters may be secured to a first side of the casing, wherein each of the first and second conductive members extend through holes in each of the at least two busbars and out of a second side of the casing opposite the first side, the method may include coupling the first and second conductive members to terminals at the second side of the casing.

In various examples, the method may include providing electrical grounding and electromagnetic shielding with the casing.

In various examples, the casing of the method may include at least two pieces, wherein the at least two pieces are electrically isolated from each other, and the method may include independently providing electrical grounding with the at least two pieces of the casing.

A vehicle is provided that, in one example, includes a rechargeable energy storage system (RESS) configured to output an electrical current at a first of primary voltage, a power conversion system configured to convert the electrical current from the primary voltage to a second or secondary voltage, and an electrical system configured to provide the electrical current at the secondary voltage to one or more accessories of the vehicle. The power conversion system includes at least two power converters configured to convert the electrical current from the primary voltage to the secondary voltage, an elongated casing having walls and a cavity defined therebetween, wherein the at least two power converters are secured to exterior surfaces of the elongated casing, a stack that includes at least two busbars enclosed within the elongated casing that are each configured to conduct the electrical current at the secondary voltage from the at least two power converters, wherein each of the at least two busbars within the stack are electrically isolated from each other and from the elongated casing with isolation layers that are disposed between each of the at least two busbars and between the at least two busbars and the elongated casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar, and terminals secured to the elongated casing and configured to conduct the electrical current at the secondary voltage from the at least two busbars.

In various examples, the vehicle may include conductive members extending from the POWER converters and into the elongated casing, wherein a first conductive member of the conductive members electrically couples the first power converter to the first busbar and a second conductive member of the conductive members electrically couples the second power converter to the second busbar, wherein the power converters are secured to a first side of the elongated casing, each of the conductive members extend through holes in each of the at least two busbars and out of a second side of the elongated casing opposite the first side, wherein the conductive members are coupled to the terminals at the second side of the elongated casing.

In various examples, the elongated casing of the vehicle may include at least two pieces, wherein the at least two pieces are electrically isolated from each other, and the at least two pieces are configured to independently provide electrical grounding.

BRIEF DESCRIPTION OF THE DRAWINGS

The examples will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding introduction or the following detailed description.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an example of the present disclosure.

Figure 1:
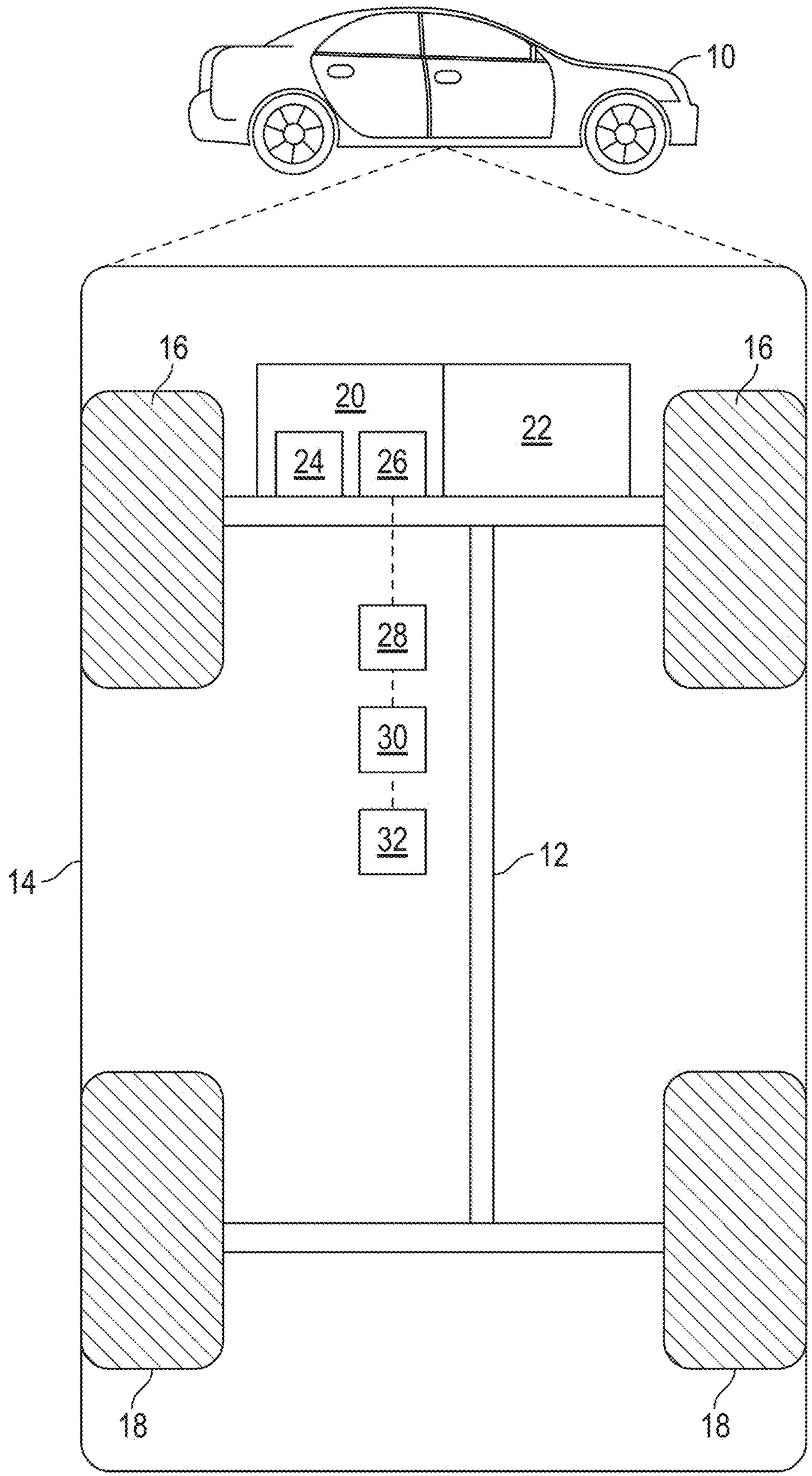
FIG. 1 is a functional diagram of a vehicle comprising an electrical power system in accordance with an example.

FIG. 1 illustrates a vehicle 10, according to an example. In certain examples, the vehicle 10 comprises an automobile. In various examples, the vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD), and/or various other types of vehicles or mobile platforms in certain examples.

As depicted in FIG. 1, the exemplary vehicle 10 generally includes a chassis 12, a body 14, front wheels 16, and rear wheels 18. The body 14 is arranged on the chassis 12 and substantially encloses components of the vehicle 10. The body 14 and the chassis 12 may jointly form a frame. The wheels 16-18 are each rotationally coupled to the chassis 12 near a respective corner of the body 14.

The vehicle 10 further includes a propulsion system 20 having an electric motor 26 and, optionally, an internal combustion engine 24 (e.g., a gasoline or diesel fueled combustion engine). A transmission system 22 transmits power from the propulsion system 20 to the wheels 16-18 according to selectable speed ratios. According to various examples, the transmission system 22 may include a step-ratio automatic transmission, a continuously-variable transmission, or other appropriate transmission. A rechargeable energy storage system (RESS) 28 is provided for storing and supplying electrical power for the electric motor 26 and/or other systems connected to one or more electrical grids or systems 30 onboard the vehicle 10. The electrical system(s) 30 may couple the RESS 28 to one or more accessories 32 of the vehicle 10, such as audio devices, lighting devices, etc.

Figure 2:
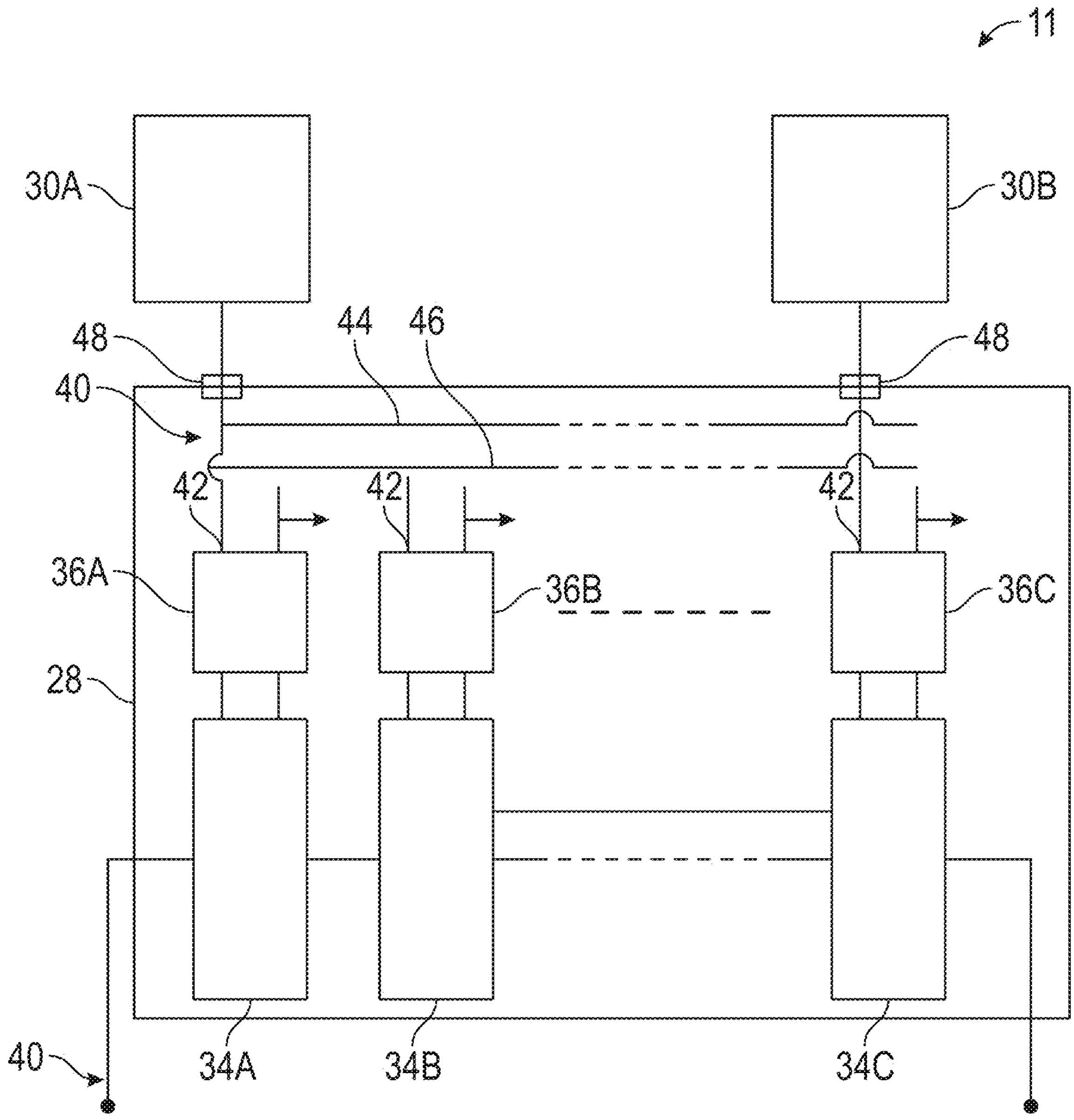
FIG. 2 is a schematic diagram illustrating certain aspects of the electrical power system of FIG. 1 in accordance with an example.

FIG. 2 illustrates a schematic diagram of an electrical power system 11 having a redundant distribution configuration in accordance with various examples. The electrical power system may be operable for redundantly providing electrical power from the RESS 28 to the electrical systems 30, which are shown for exemplary purposes to include a first electrical system 30A and a second electrical system 30B as more or less electrical systems may be included. The RESS 28 may be of the type having a plurality of battery cells arranged according to a plurality of battery groups 34 (shown as first, second, and third battery groups 34A, 34B, and 34C), with each of the battery groups 34 being associated with a power converter 36 (shown as power converters 36A, 36B, and 36C). The power converters 36 may be unidirectional and/or bidirectional direct current-to-direct current (DC-DC) converters or other types of devices operable for managing power transfer. The RESS 28 may include a high voltage (HV) interface 40 and a low voltage (LV) interface 38, with the HV interface 40 operable for exchanging HV electrical power with the electric motor 26 and/or an HV bus and the LV interface 38 operable via connections 48 for exchanging LV electrical power with the first and second electrical systems 30A and 30B. The electrical systems 30A and 30B are described with respect to being reliant upon DC power for nonlimiting purposes as the present disclosure contemplates one or more of the electrical systems utilizing alternating current (AC) power, which may relatedly include one or more of the power converters 36 being a DC-AC converter. The electrical power system 11 may be configured to provide a redundant distribution system having at least two busbars 44 and 46 configured for redundantly connecting the electrical systems 30A and 30B with the LV interface 38. The redundant configuration may be operable for maintaining operability of the electrical systems 30A and 30B during a disconnect event, such as during an event resulting from one of the busbars 44 and 46 and/or other connection being unavailable due to do a driving or other incident. The redundant distribution configuration may be advantageous in eliminating or ameliorating the need for an LV battery or other backup system to supply electrical power for the electrical systems 30A and 30B independently of the RESS 28 during normal operation, that is, the electrical systems 30A and 30B may be entirely reliant upon an exchange of electric power with the RESS 28. The vehicle 10 may include charging modules or other features (not shown) to facilitate charging the RESS 28 and/or providing power to the electrical systems 30A and 30B via charging stations, utility grids, etc. from additional sources offboard the vehicle 10. The present disclosure contemplates the RESS 28 including other configurations, including those that may not rely upon separate branches for each battery groups 34 and the power converters 36, which may in turn result in differing arrangements for the busbars 44 and 46. Each of the power converters 36 may be configured for providing at least one LV output 42. In various examples, some of the LV outputs 42 may be connected to the first busbar 44 and some of the LV outputs 42 may be connected to the second busbar 46. In this example, the LV outputs 42 connect to either the first busbar 44 or the second busbar 46 in an alternating manner. A ground (not labeled) is shown to represent the power converters 36, the electrical systems 30A and 30B, etc. connected to a vehicle ground, as one skilled in the art may appreciate to facilitate the operations and configurations contemplated herein.

Figure 3:
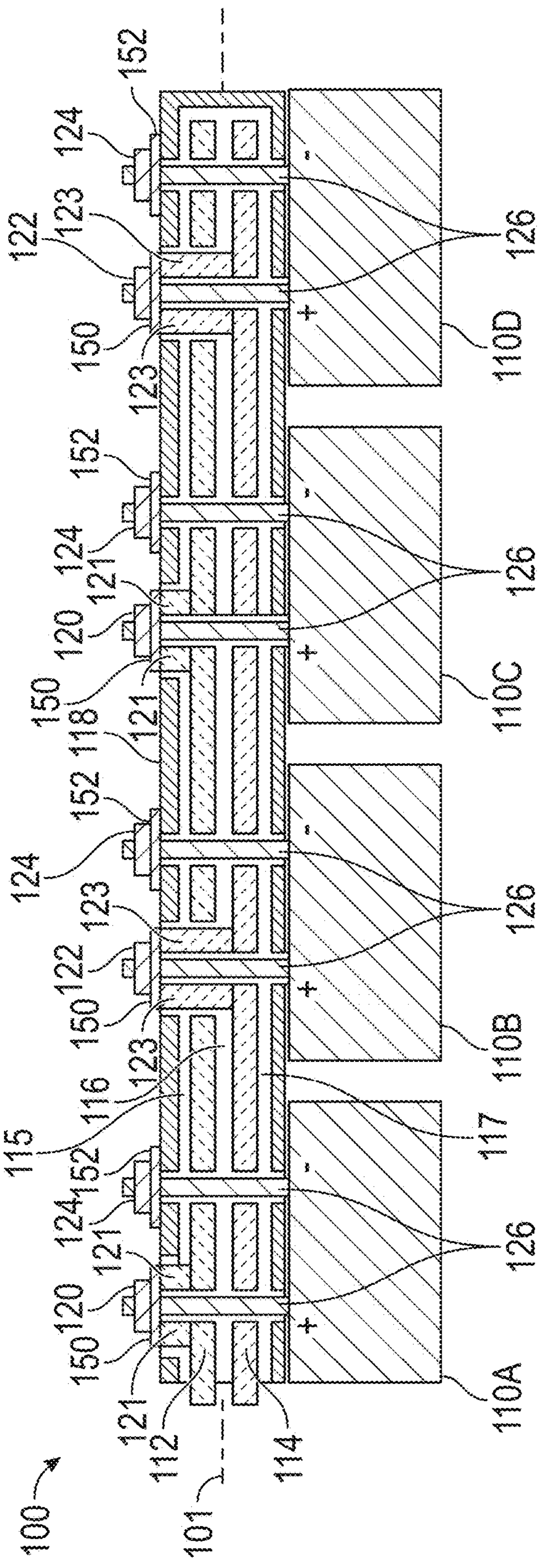
FIG. 3 is a cross-sectional view of a voltage conversion assembly in accordance with an example.
Figure 4:
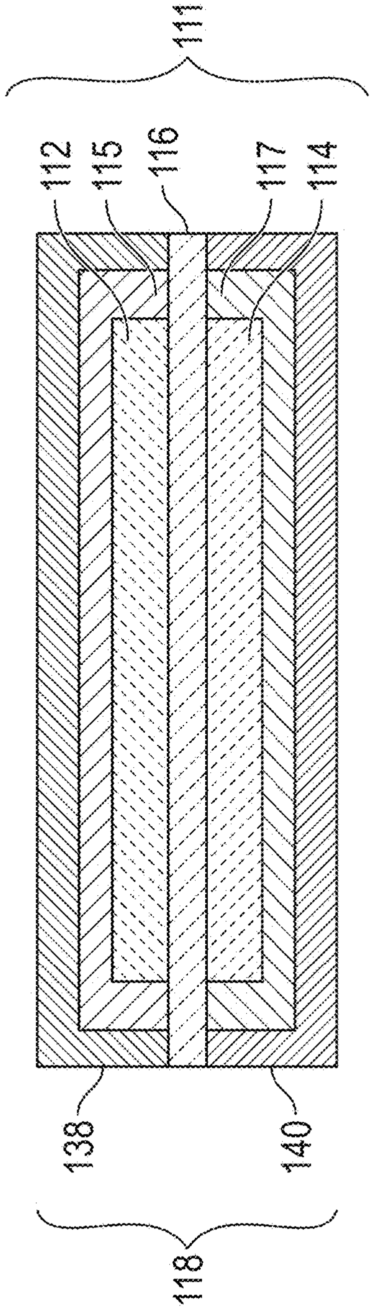
FIG. 4 is a cross-sectional view of a portion of the assembly of FIG. 3 in accordance with an example.
Figure 5:
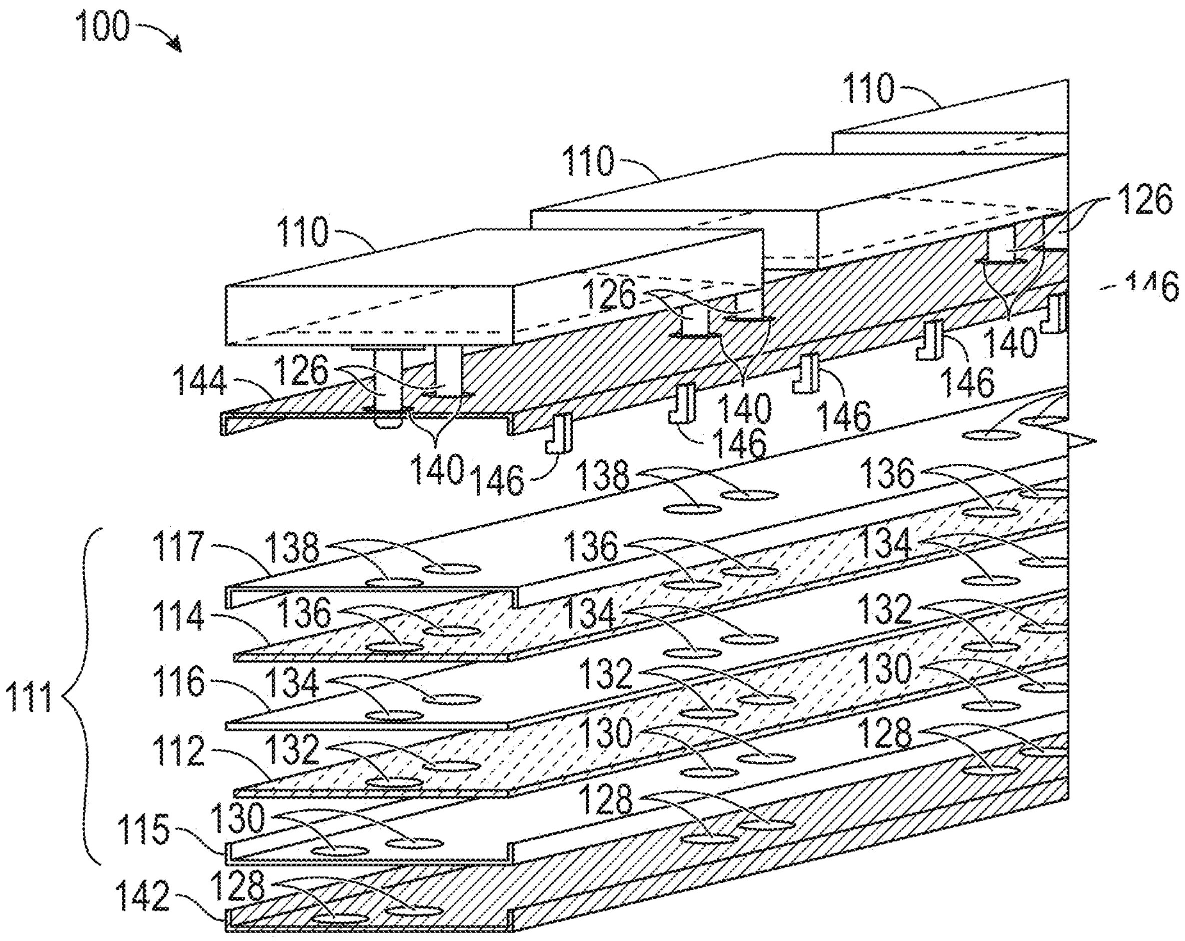
FIG. 5 is an exploded view of the assembly of FIG. 3 in accordance with an example.

FIGS. 3-5 illustrate various aspects of a voltage conversion assembly 100 configured to provide redundant DC-DC conversion in accordance with various examples. In some examples, the assembly 100 may be installed in the electrical power system of FIG. 2 and define the power converters 36, and the LV interface 38.

The assembly 100 includes a casing 118 and two or more direct current-to-direct current (DC-DC) converters 110 secured to the casing 118. In this example, the casing 118 includes a first member 142 and a second member 144 that are elongated along a longitudinal axis 101 thereof, and the DC-DC converters 110 are secured to exterior surfaces of the second member 144 and aligned along the longitudinal axis 101. However, the assembly 100 is not limited to this arrangement, and the casing 118 may have other shapes, and the DC-DC converters 110 may be secured thereto in other patterns.

The DC-DC converters 110 are configured to receive an electrical current at a first or primary voltage and output an electrical current at a second or secondary voltage. The DC-DC converters 110 may be any type of DC-DC converter configured to modify the voltage of an electrical current. Although the examples herein are described in reference to DC electrical systems, the assembly 100 may alternatively include direct current-to-alternating current (AC-AC) converters configured to modify the voltage of an AC for an AC electrical system. In the examples of FIGS. 3-6, the DC-DC converters 110 are printed circuit boards directly secured to the exterior surfaces of the casing 118.

The casing 118 includes walls that define therebetween a cavity. A stack 111 that includes at least first and second busbars 112 and 114 is enclosed within the cavity of the casing 118. The busbars 112 and 114 are each elongated and substantially planar. The busbars 112 and 114 extend within the casing 118 along the longitudinal axis 101 thereof and, in this example, are parallel to each other. The busbars 112 and 114 are electrically isolated from each other and from the casing 118. In this example, first, second, and third isolation layers 115, 116, and 117 are enclosed within the casing 118 and, in combination, surround each of the busbars 112 and 114. That is, the first isolation layer 115 is disposed between the first busbar 112 and the casing 118, the second isolation layer 116 is disposed between the busbars 112 and 114, and the third isolation layer 117 is disposed between the second busbar 114 and the casing 118. In some examples, the isolation layers 115, 116, and 117 are each formed of low electrical conductivity polymer materials, that is, polymer materials having an electrical conductivity of, for example, less than $1\times10^{-8}$ siemens per meter. Notably, the stack 111 may have more busbars and isolation layers therein depending on the application.

The DC-DC converters 110 are electrically coupled to the busbars 112 and 114, and the busbars 112 and 114 are each configured to conduct the electrical current at the secondary voltage that is output from the DC-DC converters 110. Various methods may be used to electrically couple the DC-DC converters 110 to the busbars 112 and 114. In this example, the assembly 100 includes conductive members 126 that extend from the DC-DC converters 110, into the casing 118 through holes 140 of in the second member 144, through holes 138 in the third isolation layer 117, through holes 136 in the second busbar 114, through holes 134 in the second isolation layer 116, through holes 132 in the first busbar 112, through holes 130 in the first isolation layer 115, and out of holes 128 in the second member 144 at a second side of the casing 118 opposite a first side thereof to which the DC-DC converters 110 are secured. Distal ends of the conductive members 126 opposite the DC-DC converters 110 are coupled to first, second, and third sets of terminals 120, 122, 124 at the second side of the casing 118. The busbars 112 and 114, and the conductive members 126 may each be formed of various conductive materials, such as certain metallic materials such as, but not limited to, copper, aluminum, and alloys thereof.

To promote redundancy and reliability of the assembly 100, the busbars 112 and 114 may each be electrically coupled to separate sets of the DC-DC converters 110. In the example of FIG. 3, the DC-DC converters 110 are individually coupled to one the busbars 112 and 114 in an alternating manner. That is, a first DC-DC converter 110A is coupled to the first busbar 112 and not coupled to the second busbar 114, a second DC-DC converter 110B is coupled to the second busbar 114 and not coupled to the first busbar 112, a third DC-DC converter 110C is coupled to the first busbar 112 and not coupled to the second busbar 114, and a fourth DC-DC converter 110D is coupled to the second busbar 114 and not coupled to the first busbar 112. With this exemplary arrangement, the first set of terminals 120 are all electrically coupled to the first busbar 112 and the second set of terminals 122 are all electrically coupled to the second busbar 114. The third set of terminals 124 are not electrically coupled to either of the busbars 112, 114, and instead provide grounding for the corresponding DC-DC converters 110. In some examples, the third set of terminals 124 provide grounding by electrical contact with the casing 118. In some examples, the third set of terminals 124 are electrically coupled to the casing 118 via conductive washers 152. In some examples, the first set of terminals 120 and the second set of terminals 122 are electrically isolated from the casing 118 via insulative washers 150.

In the example of FIG. 5, the busbars 112 and 114 may be electrically coupled to, or not coupled to, each of the DC-DC converters 110 via the conductive members 126 in various manners. For example, the holes 132 and 136 may vary in diameter depending on whether the busbars 112 and 114 are intended to be coupled to each of the conductive members 126, wherein larger diameters allow the conductive members 126 to pass through without making electrical contact and wherein smaller diameters allow the conductive member 126 to pass through while making electrical contact or sufficiently close such that electrical contact may be made therebetween with, for example, a weld, conductive paste, etc. In some examples, the conductive members 126 are each welded to one of the busbars 112 and 114 and not to the other of the busbars 112 and 114. In the examples of FIG. 3, the busbar 112 is physical coupled with the terminals 120 by first conductive cylinders 121 extending therebetween, and the busbar 114 is physical coupled with the terminals 122 by second conductive cylinders 123 extending therebetween. In some examples, the first and second conductive cylinders 121 and 123 may be welded to the busbars 112 and 114, respectively. In some examples, the conductive cylinders 121 and 123 may be replaced with bends in the busbars 112 and 114 that extend to the terminals 120 and 122, respectively.

Figure 6:
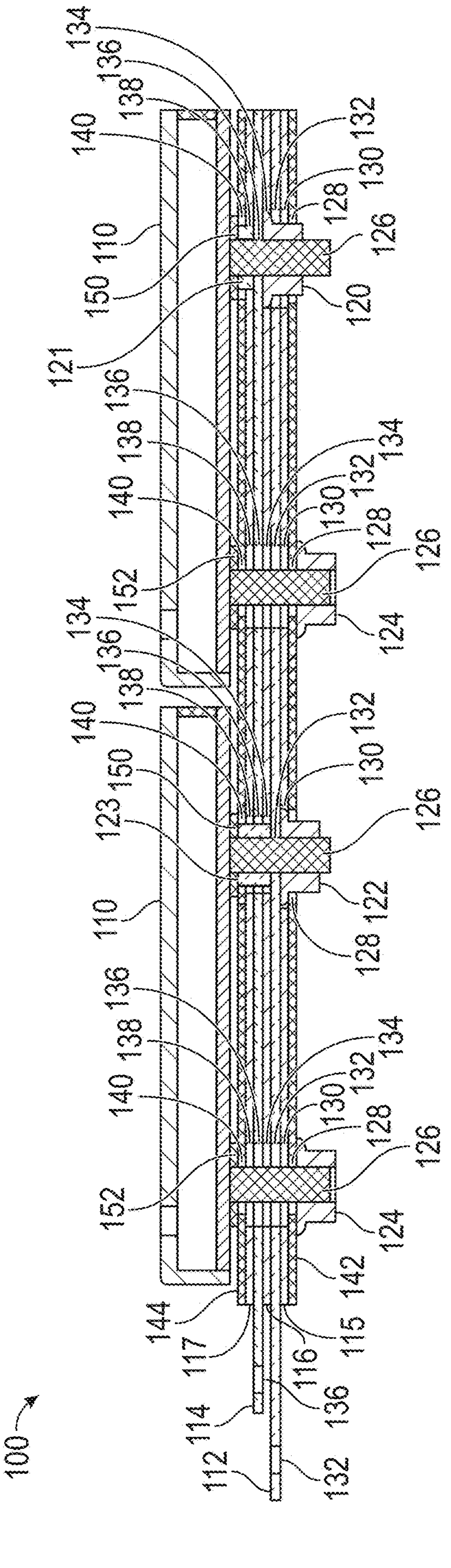
FIG. 6 is a cross-sectional view of a voltage conversion assembly in accordance with an example.

FIG. 6 presents an alternative arrangement wherein the conductive cylinders 121 and 123 are disposed between the DC-DC converters 110 and the busbars 112 and 114, and the terminals 120 and 122 are recessed within the casing 118. Despite this alternative arrangement, the voltage conversion assembly 100 may function in substantially the same manner and/or provide the same functionality.

In the examples of FIGS. 3-6, the DC-DC converters 110 are secured to the casing 118, and the busbars 112 and 114 within the casing 118 are arranged in the stack 111. Such arrangements have various benefits, including ease of manufacturing and a reduction in space relative to, for example, planar arrangements. Other benefits may be provided depending on the specific components used in the assembly 100. For example, the casing 118 may be configured to entirely or substantially enclose the busbars 112 and 114 and configured to provide electromagnetic shielding. This shielding function may protect the DC-DC converters 110 and potentially other devices near the assembly 100. The casing 118 may be in direct contact with or in thermal contact with the DC-DC converters 110 and be configured to conduct heat from the DC-DC converters 110, that is, function as a heatsink. The casing 118 may be electrically conductive and configured to provide electrical grounding (e.g., to the DC-DC converters 110).

The casing 118 may include various materials, including certain metallic materials. In some examples, the casing 118 may be formed of a metallic material having sufficient electrical conductivity to provide a grounding function, sufficient thermal conductivity to provide a heatsink function, and sufficient electromagnetic shielding to prevent or significantly reduce the likelihood of interference with the operation of the DC-DC converters 110. In some examples, the casing 118 may be formed of a steel.

In some examples, such as the example of FIGS. 3-6, the casing 118 may include at least two assembled pieces (e.g., the first and second members 142 and 144) and the pieces may be electrically isolated from each other. In such examples, the pieces of the casing 118 may be configured to independently provide electrical grounding. The pieces of the casing 118 may be electrically isolated from each other with, for example, an intermediate member formed of a nonconductive material, such as a nonconductive polymeric seal. In the example of FIGS. 3-6, the first and second members 142 and 144 of the casing 118 are electrically isolated from each other by outermost portions of the second isolation layer 116. The pieces of the casing 118 may be coupled to each other in various manners, such as with nonconductive adhesive materials, nonconductive fasteners, etc. In FIG. 5, the second member 144 includes fasteners 146 configured to clip onto an outer edge of the first member 142 and thereby secure the first and second members 142 and 144 with the stack 111 therebetween.

Figure 7:
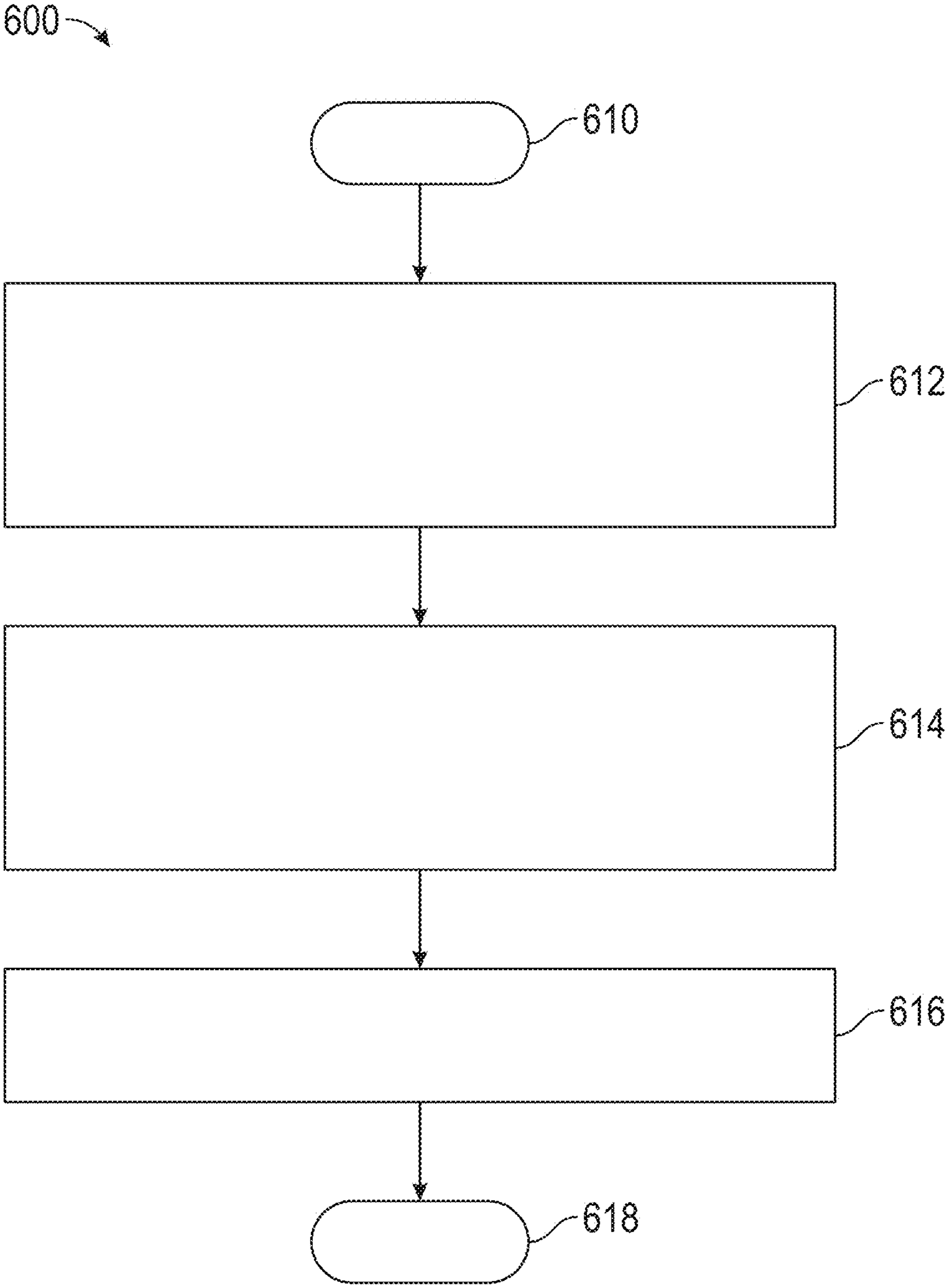
FIG. 7 is a flow chart illustrating a method for converting an electrical current from a primary voltage to a secondary voltage in accordance with an example.

With reference now to FIG. 7 and with continued reference to FIGS. 1-6, a flowchart provides a method 600 for converting an electrical current from a first or primary voltage to a second or secondary voltage, for example, as performed by the assembly 100, in accordance with various examples. As can be appreciated in light of the disclosure, the order of operation within the method 600 is not limited to the sequential execution as illustrated in FIG. 7, but may be performed in one or more varying orders as applicable and in accordance with the present disclosure.

In one example, the method 600 may start at 610. At 612, the method 600 may include converting an electrical current from a first or primary voltage to a second or secondary voltage with at least two DC-DC converters that are secured to exterior surfaces of a casing. At 614, the method 600 may include conducting the electrical current at the secondary voltage from the DC-DC converters with a stack that includes at least two busbars enclosed within a cavity of the casing. In some examples, a first DC-DC converter of the at least two DC-DC converters is electrically coupled to a first busbar of the busbars and not electrically coupled to a second busbar of the busbars, and a second DC-DC converter of the at least two DC-DC converters is electrically coupled to the second busbar and not electrically coupled to the first busbar. At 616, the method 600 may include supplying the electrical current at the secondary voltage to an electrical system. The method 600 may end at 618.

While at least one example has been presented in the foregoing detailed description, it should be appreciated that a vast number of variations exist. It should also be appreciated that the examples are not intended to limit the scope, applicability, or configuration of the disclosure in any way. Rather, the foregoing detailed description will provide those skilled in the art with a convenient road map for implementing the examples. It should be understood that various changes can be made in the function and arrangement of elements without departing from the scope of the disclosure as set forth in the appended claims and the legal equivalents thereof.

What is claimed is:

1. A system, comprising:

at least two power converters configured to convert an electrical current from a primary voltage to a secondary voltage;

a casing having walls and a cavity defined therebetween, wherein the at least two power converters are secured to exterior surfaces of the casing;

a stack that includes at least two busbars enclosed within the casing that are each configured to conduct the electrical current at the secondary voltage from the at least two power converters, wherein each of the at least two busbars within the stack are electrically isolated from each other and from the casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar; and terminals secured to the casing and configured to conduct the electrical current at the secondary voltage from the at least two busbars to an electrical system coupled to the terminals.

2. The system of claim 1, further comprising isolation layers enclosed within the casing and disposed between each of the at least two busbars and between the at least two busbars and the casing.

3. The system of claim 2, wherein the isolation layers include low electrical conductivity polymer materials.

4. The system of claim 1, wherein the casing is elongated and the at least two power converters are aligned along the casing.

5. The system of claim 1, wherein the power converters are printed circuit boards directly secured to the exterior surfaces of the casing, wherein the casing is configured to conduct heat from the power converters.

6. The system of claim 1, further comprising conductive members extending from the power converters and into the casing, wherein a first conductive member of the conductive members electrically couples the first power converter to the first busbar and a second conductive member of the conductive members electrically couples the second power converter to the second busbar.

7. The system of claim 6, wherein the power converters are secured to a first side of the casing, each of the conductive members extend through holes in each of the at least two busbars and out of a second side of the casing opposite the first side, wherein the conductive members are coupled to the terminals at the second side of the casing.

8. The system of claim 1, wherein the casing is configured to provide electrical grounding and electromagnetic shielding.

9. The system of claim 8, wherein the casing includes at least two pieces, the at least two pieces are electrically isolated from each other, and the at least two pieces are configured to independently provide electrical grounding.

10. A method, comprising:

converting an electrical current from a primary voltage to a secondary voltage with at least two power converters that are secured to exterior surfaces of a casing;

conducting the electrical current at the secondary voltage from the power converters with a stack that includes at least two busbars enclosed within a cavity of the casing, wherein each of the at least two busbars within the stack are electrically isolated from each other and from the casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar; and supplying the electrical current at the secondary voltage to an electrical system.

11. The method of claim 10, further comprising electrically isolating the at least two busbars from each other and from the casing with isolation layers enclosed within the casing.

12. The method of claim 10, further comprising securing the power converters to the casing, wherein the casing is elongated and the at least two power converters are aligned along the casing.

13. The method of claim 10, wherein the power converters are printed circuit boards, and securing the power converters to the casing includes directly securing the power converters to the exterior surfaces of the casing such that the casing conducts heat from the power converters during operation thereof.

14. The method of claim 10, further comprising electrically coupling the first power converter to the first busbar with a first conductive member extending from the first power converter and into the casing, and electrically coupling the second power converter to the second busbar with a second conductive member extending from the second power converter and into the casing.

15. The method of claim 14, wherein the power converters are secured to a first side of the casing, each of the first and second conductive members extend through holes in each of the at least two busbars and out of a second side of the casing opposite the first side, the method including coupling the first and second conductive members to terminals at the second side of the casing.

16. The method of claim 10, further comprising providing electrical grounding and electromagnetic shielding with the casing.

17. The method of claim 10, wherein the casing includes at least two pieces, the at least two pieces are electrically isolated from each other, and the method includes independently providing electrical grounding with the at least two pieces of the casing.

18. A vehicle, comprising:

a rechargeable energy storage system (RESS) configured to output an electrical current at a primary voltage;

a power conversion system comprising:

at least two power converters configured to convert the electrical current from the primary voltage to a secondary voltage;

an elongated casing having walls and a cavity defined therebetween, wherein the at least two power converters are secured to exterior surfaces of the elongated casing;

a stack that includes at least two busbars enclosed within the elongated casing that are each configured to conduct the electrical current at the secondary voltage from the at least two power converters, wherein each of the at least two busbars within the stack are electrically isolated from each other and from the elongated casing with isolation layers that are disposed between each of the at least two busbars and between the at least two busbars and the elongated casing, wherein a first power converter of the at least two power converters is electrically coupled to a first busbar of the at least two busbars and not electrically coupled to a second busbar of the at least two busbars, and a second power converter of the at least two power converters is electrically coupled to the second busbar and not electrically coupled to the first busbar; and terminals secured to the elongated casing and configured to conduct the electrical current at the secondary voltage from the at least two busbars; and an electrical system configured to provide the electrical current at the secondary voltage from the at least two busbars to one or more accessories of the vehicle.

19. The vehicle of claim 18, further comprising conductive members extending from the power converters and into the elongated casing, wherein a first conductive member of the conductive members electrically couples the first power converter to the first busbar and a second conductive member of the conductive members electrically couples the second power converter to the second busbar, wherein the power converters are secured to a first side of the elongated casing, each of the conductive members extend through holes in each of the at least two busbars and out of a second side of the elongated casing opposite the first side, wherein the conductive members are coupled to the terminals at the second side of the elongated casing.

20. The vehicle of claim 18, wherein the elongated casing includes at least two pieces, the at least two pieces are electrically isolated from each other, and the at least two pieces are configured to independently provide electrical grounding.

* * * * *